(12) United States Patent
Chen et al.

(10) Patent No.: US 8,896,024 B1
(45) Date of Patent: Nov. 25, 2014

(54) ELECTROSTATIC DISCHARGE PROTECTION STRUCTURE AND ELECTROSTATIC DISCHARGE PROTECTION CIRCUIT

(71) Applicant: United Microelectronics Corp., Hsinchu (TW)

(72) Inventors: Yi-Chun Chen, Pingtung County (TW); Li-Cih Wang, Taoyuan County (TW); Lu-An Chen, Hsinchu County (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 8 days.

(21) Appl. No.: 13/940,081

(22) Filed: Jul. 11, 2013

(51) Int. Cl.
  *H01L 29/66* (2006.01)
  *H01L 27/02* (2006.01)
  *H01L 29/74* (2006.01)

(52) U.S. Cl.
  CPC ............ *H01L 27/0262* (2013.01); *H01L 29/74* (2013.01)
  USPC ........... 257/173; 257/565; 257/572; 257/573; 257/577; 257/593; 257/E27.019

(58) Field of Classification Search
  CPC . H01L 27/0262; H01L 29/7436; H01L 29/78; H01L 27/0251; H01L 27/0255; H01L 27/0259; H01L 27/0288; H01L 29/0692; H01L 29/7835; H01L 29/7322; H01L 27/0821; H01L 29/66242; H01L 29/66272; H01L 29/7378

USPC ................. 257/173, 565, 572, 573, 577, 593, 257/E27.019
See application file for complete search history.

(56) References Cited

U.S. PATENT DOCUMENTS

| | | | |
|---|---|---|---|
| 5,465,189 A | 11/1995 | Polgreen et al. | |
| 5,637,900 A | 6/1997 | Ker et al. | |
| 5,745,323 A | 4/1998 | English et al. | |
| 5,959,820 A | 9/1999 | Ker et al. | |
| 6,365,924 B1 | 4/2002 | Wang et al. | |
| 6,724,677 B1 | 4/2004 | Su et al. | |
| 6,909,149 B2 | 6/2005 | Russ et al. | |
| 7,009,252 B2 | 3/2006 | Lin et al. | |
| 7,027,276 B2 | 4/2006 | Chen | |
| 7,102,864 B2 | 9/2006 | Liu et al. | |
| 7,205,612 B2 | 4/2007 | Cai et al. | |
| 7,368,761 B1 | 5/2008 | Lai et al. | |
| 7,672,100 B2 | 3/2010 | Van Camp | |
| 2003/0076636 A1 | 4/2003 | Ker et al. | |
| 2005/0151160 A1* | 7/2005 | Salcedo et al. | ................. 257/173 |
| 2006/0267102 A1 | 11/2006 | Cheng et al. | |

* cited by examiner

*Primary Examiner* — Michelle Mandala
(74) *Attorney, Agent, or Firm* — J.C. Patents

(57) ABSTRACT

Provided is an electrostatic discharge (ESD) protection structure including a first and a second well region adjacent to each other, a first and a second doped region disposed in the first well region, a fourth and a fifth doped region disposed in the second well region, and a third doped region disposed in the first region and extending into the second well region. The second doped region is disposed between the first and the third doped regions, forming a diode with the first doped region, forming, together with the first well region and the second well region, a first bipolar junction transistor (BJT) electrically connecting to the diode, and having no contact window disposed thereon. The fourth doped region is disposed between the third and the fifth doped regions, forming a second BJT with the second well region and the first well region.

14 Claims, 10 Drawing Sheets

_US 8,896,024 B1_

ELECTROSTATIC DISCHARGE PROTECTION STRUCTURE AND ELECTROSTATIC DISCHARGE PROTECTION CIRCUIT

BACKGROUND OF THE INVENTION

1. Field of the Invention

The invention relates to a semiconductor device and a circuit formed by the semiconductor device, and more particularly, to an electrostatic discharge protection structure and an electrostatic discharge protection circuit.

2. Description of Related Art

Electrostatic discharge (ESD) is an effect in which an electric charge moves rapidly (discharge) in a short period of time through a discharge path after accumulating on a non-conductor or an ungrounded conductor. Electrostatic discharge damages the circuit formed by the components of an integrated circuit. For instance, the human body, machines used to package integrated circuits, and instruments for testing integrated circuits are all common charged bodies, and when a charged body comes in contact with a chip, the charged body may discharge to the chip. The instantaneous power of the electrostatic discharge may cause damage or failure to the integrated circuit in the chip.

The known electrostatic discharge protection apparatus is commonly built with an electrostatic discharge clamp (ESD clamp). Alternately, a silicon controlled rectifier (SCR) is used to build the electrostatic discharge protection apparatus without the use of an ESD clamp. Currently, issues faced by the SCR technology include the triggering voltage (Vt) being too high and the holding voltage ($V_h$) being too low. A triggering voltage ($V_t$) that is too high is more difficult to be triggered by the SCR, often causing the components in the circuit to become damaged before the SCR is triggered. A holding voltage that is too low causes the SCR to activate from being readily affected by noise during operation, leading to a latch-up effect after being triggered.

SUMMARY OF THE INVENTION

The invention provides an electrostatic discharge protection structure and an electrostatic discharge protection circuit. The electrostatic discharge protection structure and the electrostatic discharge protection circuit can increase the holding voltage $V_h$ of the electrostatic discharge protection structure.

The electrostatic discharge protection structure of the invention includes a first and a second well region adjacent to each other, a first and a second doped region disposed in the first well region, a fourth and a fifth doped region disposed in the second well region, and a third doped region disposed in the first well region and extending into the second well region. The first well region and the first, the third, and the fourth doped regions are of a first conductivity type. The second well region and the second and the fifth doped regions are of a second conductivity type. The second doped region is disposed between the first and the third doped regions, forming a diode with the first doped region, forming, together with the first well region and the second well region, a first bipolar junction transistor electrically connecting to the diode, and having no contact window disposed thereon. The fourth doped region is disposed between the third doped region and the fifth doped region, forming a second bipolar junction transistor with the second well region and the first well region.

In an embodiment, the first conductivity type is N-type, the second conductivity type is P-type, the first electrode is an anode, and the second electrode is a cathode.

In an embodiment, the first conductivity type is P-type, the second conductivity type is N-type, the first electrode is a cathode, and the second electrode is an anode.

In an embodiment, the electrostatic discharge protection structure further includes a gate structure disposed on the second well region between the third doped region and the fourth doped region, and the gate structure is electrically connected to the second electrode.

In an embodiment, the electrostatic discharge protection structure further includes an isolation structure disposed in the second well region between the third doped region and the fourth doped region.

In an embodiment, the isolation structure is a field oxide (FOX) layer or a shallow trench isolation (STI) structure.

In an embodiment, the first doped region is in contact with the second doped region.

In an embodiment, the first doped region is separated from the second doped region by a distance. The distance is, for instance, 0.01 μm to 1 μm.

The electrostatic discharge protection circuit includes a first bipolar junction transistor, a second bipolar junction transistor, a first resistance, a second resistance, and a diode. An emitter of the first bipolar junction transistor is coupled to a first electrode of the electrostatic discharge protection circuit, a base of the first bipolar junction transistor is coupled to the first electrode of the electrostatic discharge protection circuit through the first resistance, and a collector of the first bipolar junction transistor is coupled to a second electrode of the electrostatic discharge protection circuit through the second resistance. A base of the second bipolar junction transistor is coupled to the collector of the first bipolar junction transistor, an emitter of the second bipolar junction transistor is coupled to the second electrode of the electrostatic discharge protection circuit, and a collector of the second bipolar junction transistor is coupled to the first electrode of the electrostatic discharge protection circuit through the first resistance. The diode is disposed between the emitter of the first bipolar junction transistor and the first electrode of the electrostatic discharge protection circuit.

In an embodiment, the first bipolar junction transistor is a PNP transistor, the second bipolar junction transistor is an NPN transistor, the first electrode is an anode, the second electrode is a cathode, a positive electrode of the diode is coupled to the emitter of the first bipolar junction transistor, and a negative electrode of the diode is coupled to the first electrode of the electrostatic discharge protection circuit.

In an embodiment, the first bipolar junction transistor is an NPN transistor, the second bipolar junction transistor is a PNP transistor, the first electrode is a cathode, the second electrode is an anode, the negative electrode of the diode is coupled to the emitter of the first bipolar junction transistor, and the positive electrode of the diode is coupled to the first electrode of the electrostatic discharge protection circuit.

The electrostatic discharge protection circuit of the invention includes an anode, a cathode, a first bipolar junction transistor, a second bipolar junction transistor, a first resistance, a second resistance, and a diode. An emitter of the first bipolar junction transistor is coupled to the anode of the electrostatic discharge protection circuit, a base of the first bipolar junction transistor is coupled to the anode of the electrostatic discharge protection circuit through the first resistance, and a collector of the first bipolar junction transistor is coupled to the cathode of the electrostatic discharge protection circuit through the second resistance. A base of the second bipolar junction transistor is coupled to the collector of the first bipolar junction transistor, an emitter of the second bipolar junction transistor is coupled to the cathode of the electrostatic discharge protection circuit, and a collector of the second bipolar junction transistor is coupled to the cathode of the electrostatic discharge protection circuit through the first resistance. The diode is disposed between the emitter of the first bipolar junction transistor and the anode of the electrostatic discharge protection circuit such that the positive electrode of the diode is coupled to the emitter of the first bipolar junction transistor and the negative electrode of the diode is coupled to the anode of the electrostatic discharge protection circuit. Alternately, the diode is disposed between the emitter of the second bipolar junction transistor and the cathode of the electrostatic discharge protection circuit such that the positive electrode of the diode is coupled to the anode of the electrostatic discharge protection circuit and the negative electrode of the diode is coupled to the emitter of the second bipolar junction transistor.

In an embodiment, the first bipolar junction transistor is a PNP transistor and the second bipolar junction transistor is an NPN transistor.

Based on the above, the invention provides an electrostatic discharge protection structure and an electrostatic discharge protection circuit. By only disposing the contact window on the first doped region, the holding voltage $V_h$ of the electrostatic discharge protection structure can be increased, thereby preventing a latch-up effect due to an influence of noise to the electrostatic discharge protection structure.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
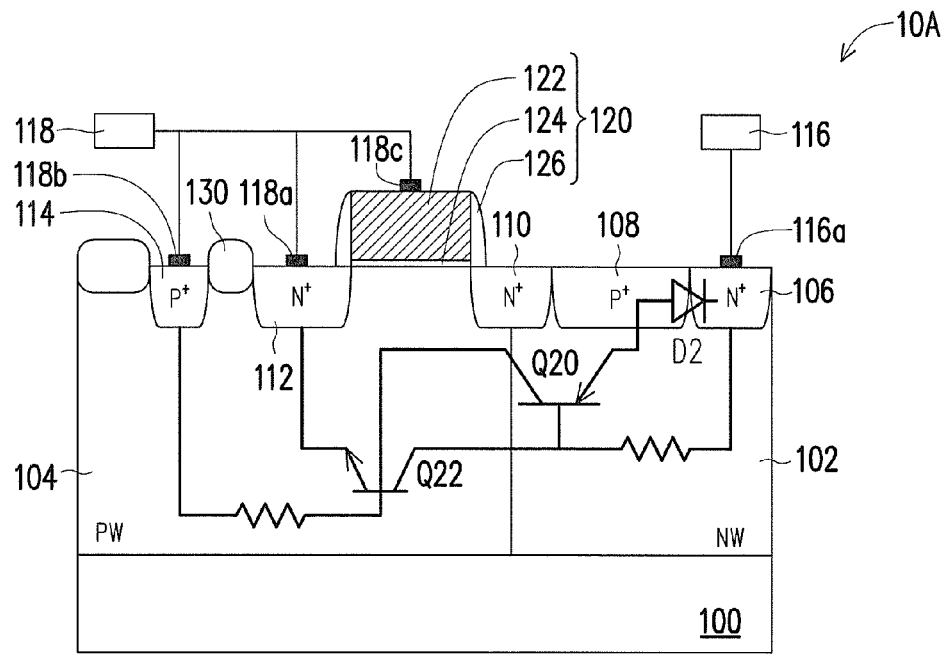
FIG. 1A to FIG. 1C are respective schematic cross-sectional diagrams of three electrostatic discharge protection structures of the first embodiment of the invention.

FIG. 1A is a schematic cross-sectional diagram of an electrostatic discharge protection structure of the first embodiment of the invention.

Referring first to FIG. 1A, an electrostatic discharge protection structure 10A of the first embodiment is disposed in a substrate 100 and includes a well region 102, a well region 104, a first doped region 106, a second doped region 108, a third doped region 110, a fourth doped region 112, and a fifth doped region 114. The well region 102, the first doped region 106, the third doped region 110, and the fourth doped region 112 are of a first conductivity type and the well region 104, the second doped region 108, and the fifth doped region 114 are of a second conductivity type. In the present embodiment, the first conductivity type is N-type and the second conductivity type is P-type. In this case, the well region 102 is an N-type well region, the first doped region 106, the third doped region 110, and the fourth doped region 112 are N-type doped regions, the well region 104 is a P-type well region, and the second doped region 108 and the fifth doped region 114 are P-type doped regions. To clearly describe the present embodiment, the conductivity type of each region in FIG. 1A is labeled with text, wherein NW and PW respectively represent an N-type well region and a P-type well region, and the "+" label represents regions with higher doping concentrations. However, the invention is not limited to the conductivity type indicated in FIG. 1A. In other embodiments, the well region 102 can also be a P-type well region. In this case, the well region 104 is an N-type well region, the first doped region 106, the third doped region 110, and the fourth doped region 112 are P-type doped regions, and the second doped region 108 and the fifth doped region 114 are N-type doped regions. Doped regions having different conductivity types can be obtained through a process of doping different dopants to the substrate 100. For instance, phosphorous or arsenic can be implanted into the substrate 100 through ion implantation to form an N-type doped region. Alternately, boron or boron trifluoride ($BF_3$) can be implanted into the substrate 100 to form a P-type doped region. The implantation energy, the implantation depth and concentration can be adjusted based on the current technical understanding and consideration for the desired electrical properties. The process means are known by those having ordinary skill in the art and are not repeated herein.

The well region 102 and the well region 104 are disposed adjacent to each other in the substrate 100. The first doped region 106 and the second doped region 108 are disposed in the well region 102. The fourth doped region 112 and the fifth doped region 114 are disposed in the well region 104. The third doped region 110 is disposed in the well region 102 and extends into the well region 104. The second doped region 108 is disposed between the first doped region 106 and the third doped region 110. The fourth doped region 112 is disposed between the third doped region 110 and the fifth doped region 114. As seen from FIG. 1A, the first doped region 106 and the third doped region 110 are regions separated by the second doped region 108. However, it should be understood that, if the electrostatic discharge protection structure is observed from the top down, the first doped region 106 and the third doped region 110 can be not in contact or be extended to connect with each other and thereby surround the second doped region 108. Moreover, the fourth doped region 112 and the fifth doped region 114 can be separated by the isolation structure 130. The isolation structure 130 can contain an insulating material such as silicon oxide. The isolation structure 130 can be a field oxide (FOX) layer or a shallow trench isolation (STI) structure.

The electrostatic discharge protection structure of the present embodiment further includes an electrode 116 and an electrode 118. When the conductivity type of each doped region is labeled as in FIG. 1A, the electrode 116 is the anode of the electrostatic discharge protection structure and the electrode 118 is the cathode of the electrostatic discharge protection structure. In the electrostatic discharge protection structure 10A, the first doped region 106 is electrically connected to the electrode 116 through a contact window 116a, and the fourth doped region 112 and the fifth doped region 114 are respectively electrically connected to the electrode 118 through a contact window 118a and a contact window 118b. However, the second doped region 108 is not electrically connected to the electrode 116.

The material of each of the contact windows 116a, 118a, and 118b can be a conductor. Moreover, the structure of each of the contact windows 116a, 118a, and 118b can include a barrier layer and a main conductive layer. The barrier layer is, for instance, a composite layer of Ti and TiN, a composite layer of Ta and TaN, or any combination thereof. The main conductive layer is, for instance, a tungsten layer, a copper layer, or an aluminum layer. The electrode 116 and the electrode 118 each contain a conductive material and the structure of each thereof can be the barrier layer with the main conductive layer added thereon. A metal silicide layer can be optionally disposed between the contact windows 116a, 118a, and 118b and the first doped region 108, the fourth doped region 112, and the fifth doped region 114 below the contact windows 116a, 118a, and 118b to ensure low contact resistance and Ohmic contact.

Moreover, the electrostatic discharge protection structure of the present embodiment can further include a gate structure 120. The gate structure 120 is disposed on the well region 104 between the third doped region 110 and the fourth doped region 112. The gate structure 120 includes, for instance, a gate dielectric layer 124 and a gate 122. The material of the gate dielectric layers 124 can also be an insulator such as silicon oxide or a high dielectric constant material having a dielectric constant greater than 4. The material of the gate 122 can be a conductor such as metal or doped polysilicon. The gate structure 120 can further include a spacer 126, and the material of the spacer 126 can be an insulator such as silicon oxide. The gate structure 120 is electrically connected to the electrode 118 through a contact window 118c. The disposition of the gate structure 120 can further reduce the triggering voltage of a silicon controlled rectifier (SCR).

Figure 1B:
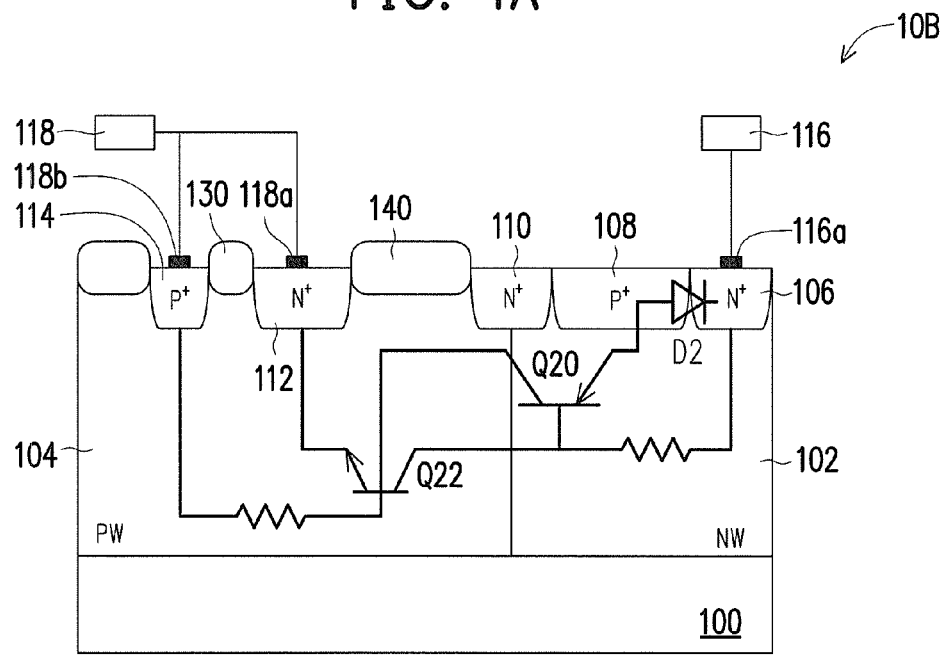
Figure 1C:
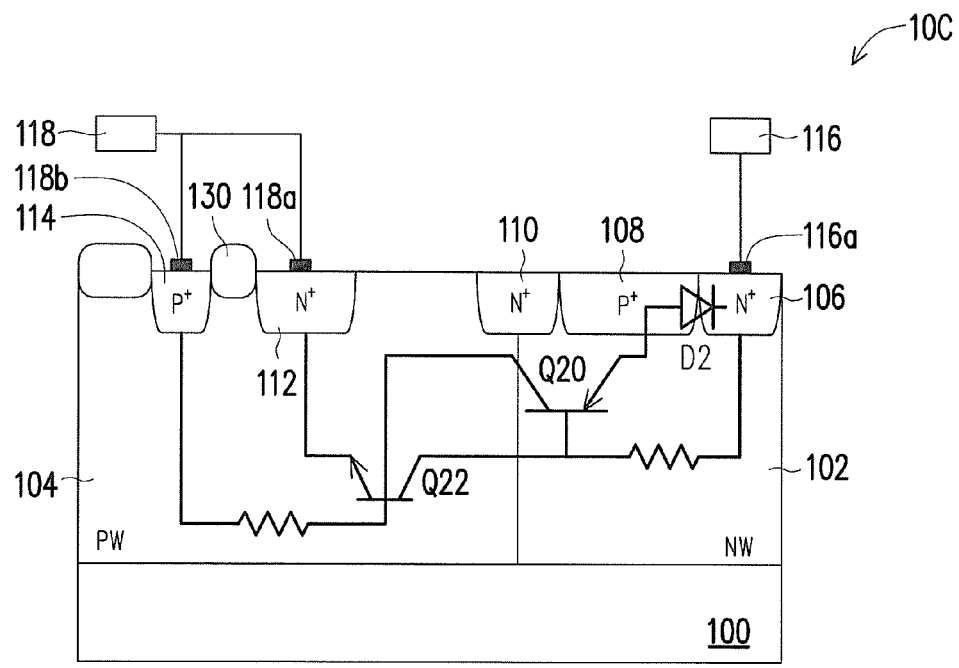

In the embodiments above, the gate structure 120 is disposed on the well region 104 of the third doped region 110 and the fourth doped region 112. However, for the invention, the gate structure 120 is an optional auxiliary structure. In another embodiment, the third doped region 110 and the fourth doped region 112 are separated by the isolation structure 140 as shown in FIG. 1B. The isolation structure 130 can contain an insulating material such as silicon oxide. The isolation structure 140 can be a FOX layer or an STI structure. In yet another embodiment, the third doped region 110 and the fourth doped region 112 are separated by the substrate 100 (well region 104) and no other structure is disposed thereon, as shown in FIG. 1C.

Referring to FIG. 1A, the second doped region 108, the well region 102, and the well region 104 foam a bipolar junction transistor (BJT) Q20. The well region 102, the well region 104, and the fourth doped region 112 faun a BJT Q22. More specifically, if current flows in from the electrode (anode) 116 of the electrostatic discharge protection structure 10A, 10B, or 10C and flows out of the electrode (cathode) 118, then the current flows through, in order, the first doped region 106, the second doped region 108, the well region 102, the well region 104, and the fourth doped region 112, whereby the $N^+/P^+/N/P/N^+$ laminated structure forms the SCR.

The third doped region 110 having a doping concentration greater than the well regions is disposed in the well region 102 and the well region 104, which is similar to disposing a reverse diode (formed by the third doped region 110 and the P-type well region 104) in the electrostatic discharge protection circuit, thereby reducing the triggering voltage of the SCR to, for instance, about 11-12V such that the SCR is more suitable for the purpose of electrostatic discharge protection.

Moreover, since no contact window is disposed on the second doped region 108, the second doped region 108 is not electrically connected to the electrode (anode) 116. Therefore, current cannot flow directly from the electrode (anode) 116 to the second doped region 108. On the other hand, current needs to first flow into the first doped region 106 from the electrode (anode) 116 and then flow into the second doped region 108 from the first doped region 106. The result is equivalent to disposing a reverse diode D2 (first doped region 106 and second doped region 108) in an equivalent circuit of the electrostatic discharge protection structure. Although the disposition of the reverse diode D2 slightly increases the triggering voltage of the electrostatic discharge protection structure (due to the need to overcome an additional junction voltage of the diode when triggering), the holding voltage of the electrostatic discharge protection structure can be significantly increased by, for instance, about 5-6V (breakdown voltage of the diode D2) such that a latch-up effect does not readily occur to the electrostatic discharge protection structure.

Figure 2A:
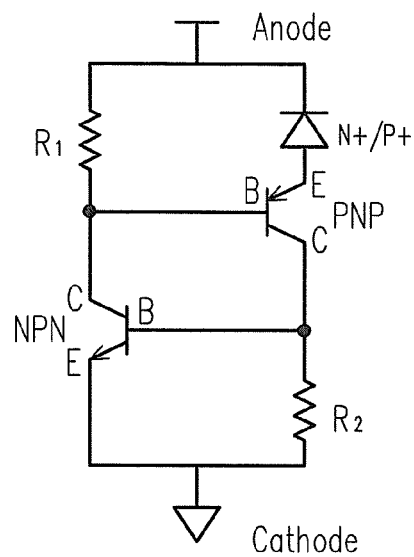
FIG. 2A is a diagram of an electrostatic discharge protection circuit of the invention.
Figure 2B:
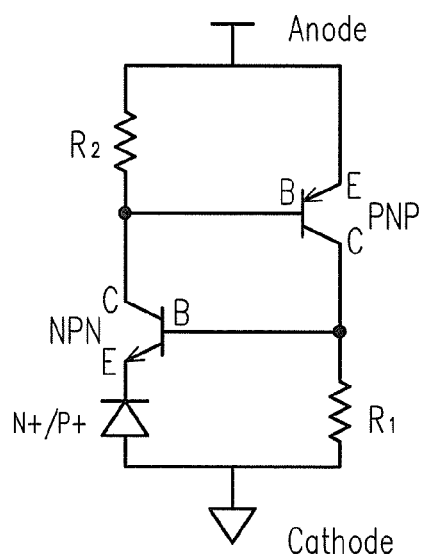
FIG. 2B is another diagram of an electrostatic discharge protection circuit of the invention.

The equivalent circuit diagram of each of the electrostatic discharge protection circuit structures 10A, 10B, and 10C of the first embodiment is as shown in FIG. 2A and FIG. 2B. Specifically, when the well region 102 of each of the electrostatic discharge protection circuit structures of the first embodiment is an N-type well region, the first doped region 106, the third doped region 110, and the fourth doped region 112 are N-type doped regions. When the well region 104 is a P-type well region, the second doped region 108 and the fifth doped region 114 are P-type doped regions. The electrode 116 is an anode. When the electrode 118 is a cathode, the equivalent circuit diagram of the electrostatic discharge protection circuit structure is as shown in FIG. 2A.

Referring to FIG. 1A and FIG. 2A, the electrostatic discharge protection circuit of FIG. 2A includes two BJTs, namely PNP and NPN, wherein the PNP transistor corresponds to the transistor Q20 of FIG. 1A and the NPN transistor corresponds to the transistor Q22. The anode and the cathode of the electrostatic discharge protection circuit respectively correspond to the electrode 116 and the electrode 118 of FIG. 1A. An $N^+/P^+$ diode of the electrostatic discharge protection circuit corresponds to the diode D2 of FIG. 1A. A resistance $R_1$ and a resistance $R_2$ respectively represent the resistance from each of the well region 102 and the well region 104. An emitter (E) of the PNP transistor of the electrostatic discharge protection circuit is coupled to the anode through the $N^+/P^+$ diode, a base (B) of the PNP transistor of the electrostatic discharge protection circuit is coupled to the anode through the resistance $R_1$, and a collector (C) of the PNP transistor of the electrostatic discharge protection circuit is coupled to the cathode through the resistance $R_2$. An emitter of the NPN transistor is coupled to the cathode, a base of the NPN transistor is coupled to the cathode through the resistance $R_2$, and a collector of the NPN transistor is coupled to the anode through the resistance $R_1$. Moreover, the base of the PNP transistor is electrically connected to the collector of the NPN transistor, and the collector of the PNP transistor is further electrically connected to the base of the NPN transistor. Current flows in from the anode electrode 116 of the electrostatic discharge protection structure, flows through the SCR formed by the $N^+/P^+$ diode, the PNP, and the NPN, and then flows out of the cathode electrode 118. In comparison to the condition without the $N^+/P^+$ diode, although the disposition of the $N^+/P^+$ diode slightly increases the triggering voltage of the electrostatic discharge protection structure (due to the need to overcome an additional junction voltage of the diode when triggering), the holding voltage of the electrostatic discharge protection structure can be significantly increased, such as by about 5-6V (breakdown voltage of the diode D2) such that the electrostatic discharge protection structure is not readily interfered by noise.

When the well region 102 of each of the electrostatic discharge protection circuit structures 10A, 10B, and 10C of the first embodiment is a P-type well region, the first doped region 106, the third doped region 110, and the fourth doped region 112 are P-type doped regions. When the well region 104 is an N-type well region, the second doped region 108 and the fifth doped region 114 are N-type doped regions. The electrode 116 is a cathode. When the electrode 118 is an anode, the equivalent circuit diagram of each of the electrostatic discharge protection circuit structure is as shown in FIG. 2B.

Referring to FIG. 2B, the electrostatic discharge protection circuit includes an anode, a cathode, and two BJTs, wherein the emitter of the NPN transistor is coupled to the anode through the $N^+/P^+$ diode, the base of the NPN transistor is coupled to the anode through the resistance $R_1$, and the collector of the NPN transistor is coupled to the cathode through the resistance $R_2$. The emitter of the PNP transistor is coupled to the anode, the base of the PNP transistor is coupled to the anode through the resistance $R_2$, and the collector of the PNP transistor is coupled to the cathode through the resistance $R_1$. Moreover, the base of the PNP transistor is electrically connected to the collector of the NPN transistor, and the collector of the PNP transistor is further electrically connected to the base of the NPN transistor.

It is known from the comparison of FIG. 2A and FIG. 2B that the difference between the two is only in the location of disposition of the diode in the circuit. That is, the diode can be disposed between the emitter of the PNP transistor and the anode of the electrostatic discharge protection circuit, and the positive electrode of the diode is coupled to the emitter of the PNP transistor and the negative electrode of the diode is coupled to the anode of the electrostatic discharge protection circuit, as shown in FIG. 2A. Alternately, the diode can also be disposed between the emitter of the NPN BJT and the cathode of the electrostatic discharge protection circuit, and the positive electrode of the diode is coupled to the cathode of the electrostatic discharge protection circuit and the negative electrode of the diode is coupled to the emitter of the NPN transistor, as shown in FIG. 2B.

Figure 1D:
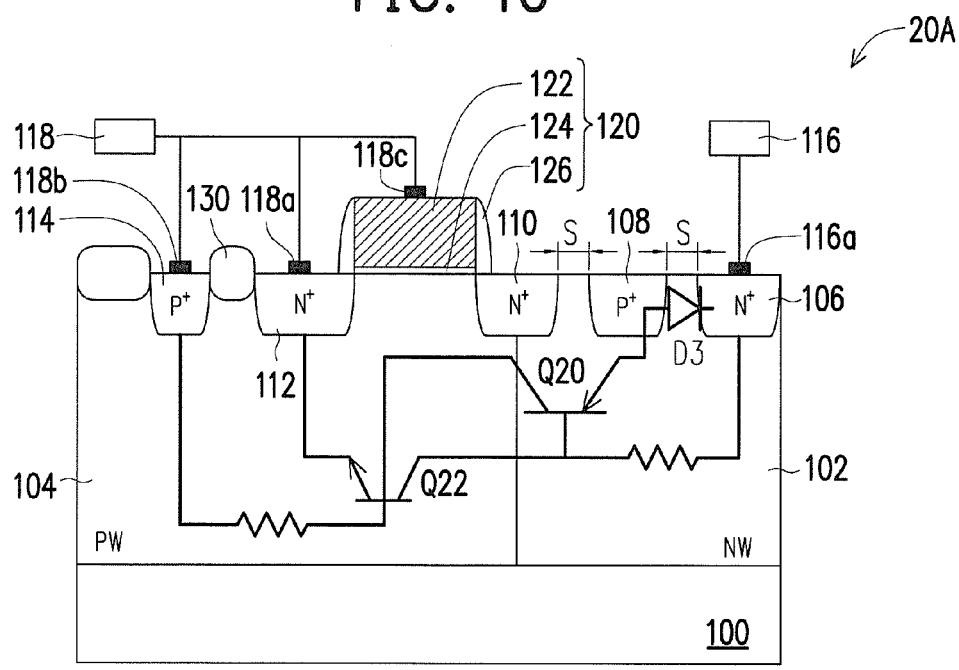
FIG. 1D to FIG. 1F are respective schematic cross-sectional diagrams of three electrostatic discharge protection structures of the second embodiment of the invention.
Figure 1E:
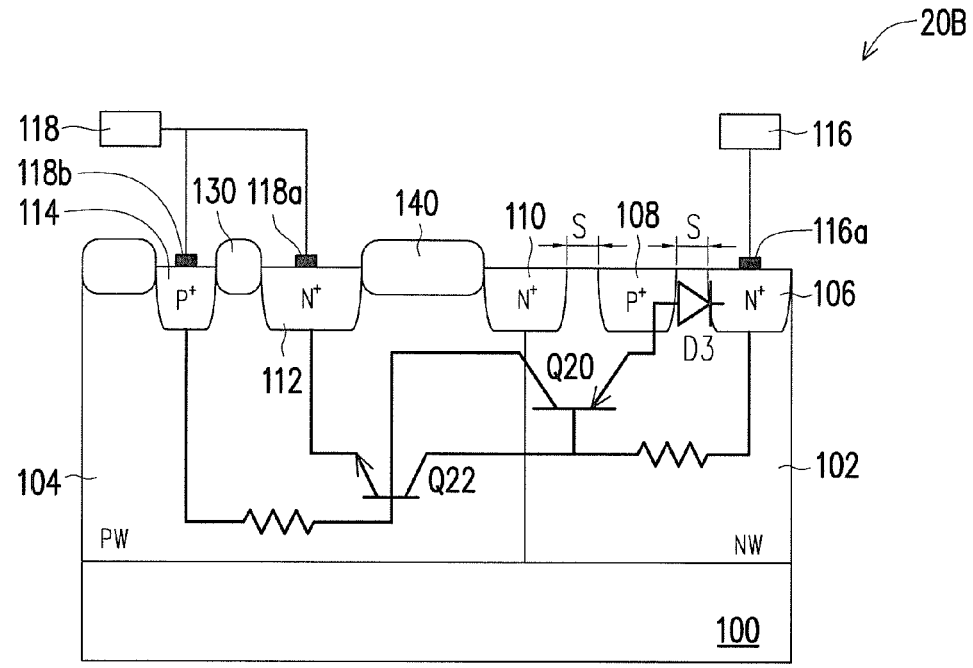
Figure 1F:
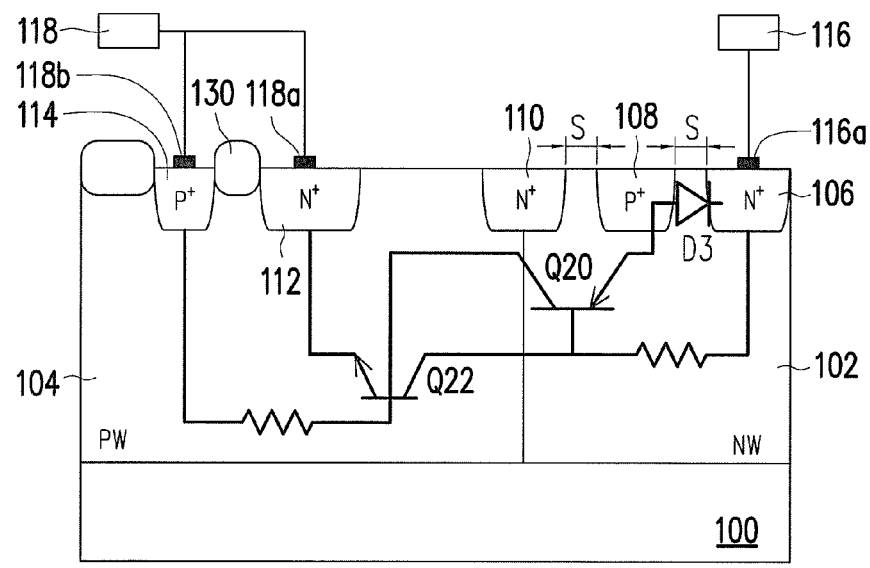

FIG. 1D to FIG. 1F are respective schematic cross-sectional diagrams of three electrostatic discharge protection structures of the second embodiment of the invention.

Referring to FIG. 1D to FIG. 1F, electrostatic discharge protection structures 20A, 20B, and 20C of the second embodiment and the electrostatic discharge protection structures 10A, 10B, and 10C of the first embodiment of the invention are very similar, with the difference being the second doped region 108 and the first doped region 106 in the first embodiment are in direct contact, and in the second embodiment, a distance S is present between the first doped region 106 and the second doped region 108. In an embodiment, the range of the distance S is, for instance, 0.01 μm to 1 μm.

Referring to the equivalent circuit illustrated in each of FIG. 1D to FIG. 1F, the electrostatic discharge protection circuit of the second embodiment is the same as that of the first embodiment. However, in the first embodiment, the reverse diode D2 in the equivalent circuit is formed by an $N^+$ region (first doped region 106) and a $P^+$ region (second doped region 108). In the second embodiment, if the S is large enough, then the reverse diode D3 may be formed by the N-type well region 102 and a $P^+$ region (second doped region 108). The result is that the junction voltage of the reverse diode D3 becomes larger. Even if the reverse diode D3 is still formed by the first doped region 106 and the second doped region 108, the presence of the distance S can still increase the junction voltage of the diode D3. Such design can further increase $V_t$ and $V_h$. In other words, according to the second embodiment, $V_t$ and $V_h$ of the electrostatic discharge protection circuit can be adjusted by changing the distance S to obtain the desired electrical properties based on application needs.

Figure 1G:
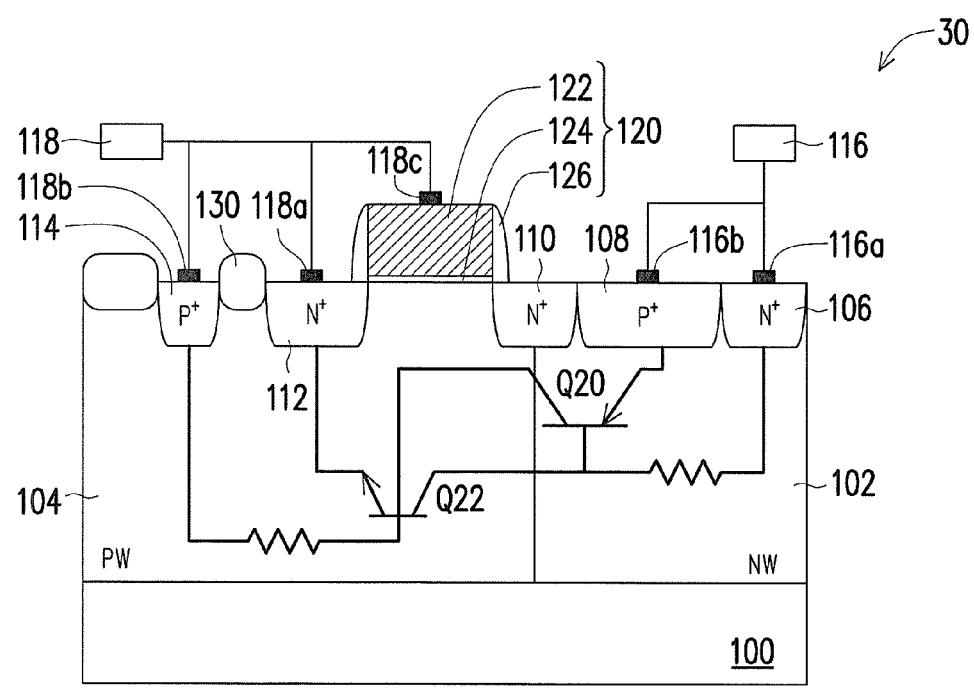
FIG. 1G is a schematic cross-sectional diagram of an electrostatic discharge protection structure of the third embodiment of the invention.

FIG. 1G is a schematic cross-sectional diagram of an electrostatic discharge protection structure of the third embodiment of the invention.

Referring to FIG. 1G, the electrostatic discharge protection structure 30 of the third embodiment and the electrostatic discharge protection structures 10A, 10B, and 10C of the first embodiment of the invention are very similar, with the difference being that in the first embodiment, the second doped region 108 is not electrically connected to the electrode 116; however, in the third embodiment, the second doped region 108 is electrically connected to the electrode 116 through a contact window 116b. Current flows in from the electrode 116 of the electrostatic discharge protection structure 30 and flows directly through the second doped region 108, the well region 102, the well region 104, and the fourth doped region 112, whereby the $P^+/N/P/N^+$ laminated structure forms the SCR, and then the current flows out of the electrode 118. Since the current does not flow into the second doped region 108 again through the first doped region 106, the reverse diode D2 (first doped region 106 and second doped region 108) is absent in comparison to the first embodiment. The absence of the reverse diode D2 of each of the electrostatic discharge protection structures 10A, 10B, and 10C of the first embodiment in the electrostatic discharge protection structure 30 of the third embodiment can reduce the triggering voltage of the electrostatic discharge protection structure (due to the need to overcome an additional junction voltage of the diode when triggering).

In the following, the efficacies of the electrostatic discharge protection structure and the electrostatic discharge protection circuit are validated through simulations and measurements.

EXPERIMENTS

Figure 3A:
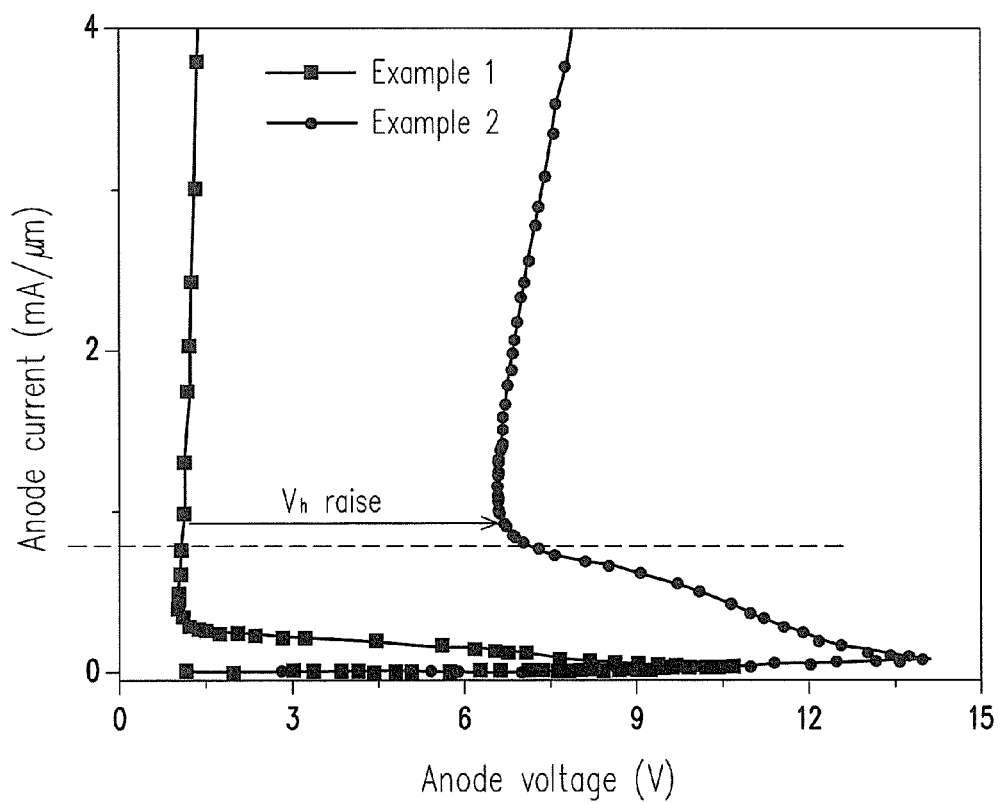
FIG. 3A is a schematic diagram of the relationship between anode current and anode voltage of an electrostatic discharge protection structure of each of example 1 and example 2 in a two-dimensional simulation.

FIG. 3A is a schematic diagram of the relationship between anode current and anode voltage of the electrostatic discharge protection structure of each of example 1 and example 2 through a two-dimensional TCAD (technology computer-aided design) simulation, wherein example 1 corresponds to the electrostatic discharge protection structure of the third embodiment (FIG. 1G) and example 2 corresponds to the electrostatic discharge protection structure of the first embodiment (FIG. 1A). Table 1 records the simulation results of $V_t$ and $V_h$ of example 1 and example 2.

TABLE 1

|  | S (μm) | $V_t$ (V) | $V_h$ (V) |
|---|---|---|---|
| Example 1 | — | 10.7 | 1.2 |
| Example 2 | 0 | 13.9 | 6.58 |
| Example 3 | 0.05 | 15.3 | 8.47 |
| Example 4 | 0.1 | 17.1 | 10.86 |

It can be seen by referring to FIG. 3A and Table 1 that, in comparison to example 1, the triggering voltage Vt of the electrostatic discharge protection structure of example 2 is slightly higher (difference of about 3V) and the holding voltage Vh of example 2 is higher by about 6V. This indicates that, although the electrostatic discharge protection structure of example 2 is slightly more difficult to trigger, good stability can be maintained after triggering and a latch-up effect does not readily occur to the circuit by noise during operation.

Figure 3C:
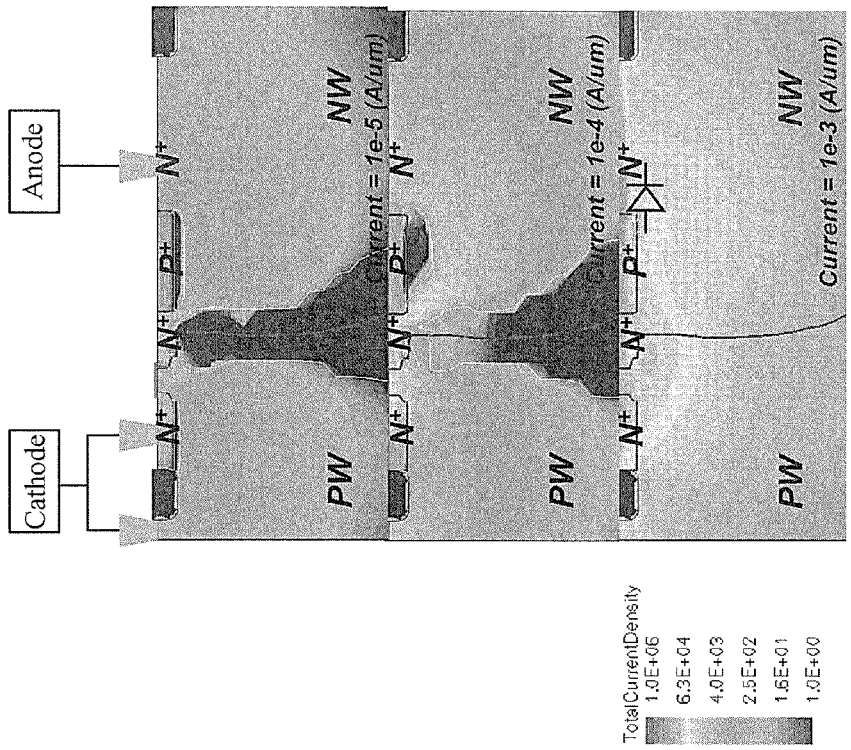
FIG. 3B and FIG. 3C are schematic diagrams of current density obtained according to the simulation experiment of example 1 and example 2.
Figure 3B:
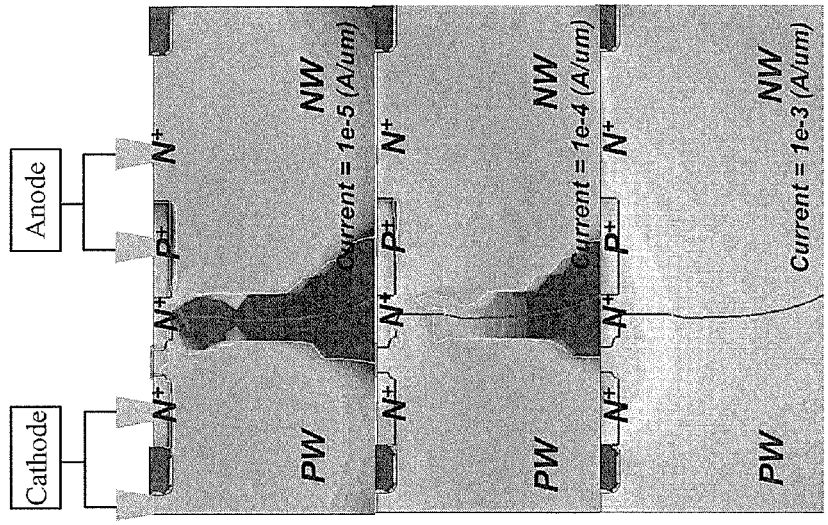

FIG. 3B and FIG. 3C are schematic diagrams of current density distribution obtained according to example 1 and example 2 respectively at the current densities of $1 \times 10^{-5}$ (1 $e^{-5}$), $1 \times 10^{-4}$ (1 $e^{-4}$), $1 \times 10^{-3}$ (1 $e^{-3}$) (A/μm).

Referring to FIG. 3B, in example 1, the anode is electrically connected to the $P^+$ region and the $N^+$ region. Here, the current flow between the two regions is relatively small. However, in example 2, the anode only needs to be electrically connected to the $N^+$ region, and the electrons flowing into the $P^+$ region need to first flow into the $N^+$ region to flow into the anode, causing very high current density between the $N^+$ region and the $P^+$ region. For instance, referring to the bottom portion of FIG. 3C, the orange block between the $N^+$ region and the $P^+$ region indicates the current density thereof is higher than the other regions, confirming that current mainly flows along this path.

Figure 4B:
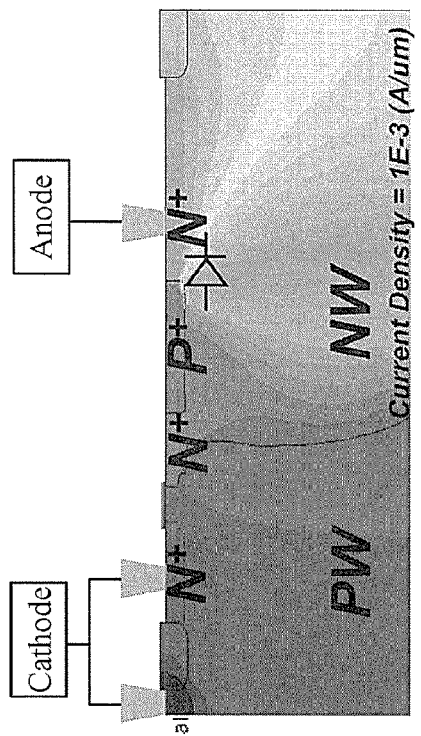
FIG. 4A and FIG. 4B are schematic diagrams of potential distribution obtained from the simulation experiment of example 1 and example 2.
Figure 4A:
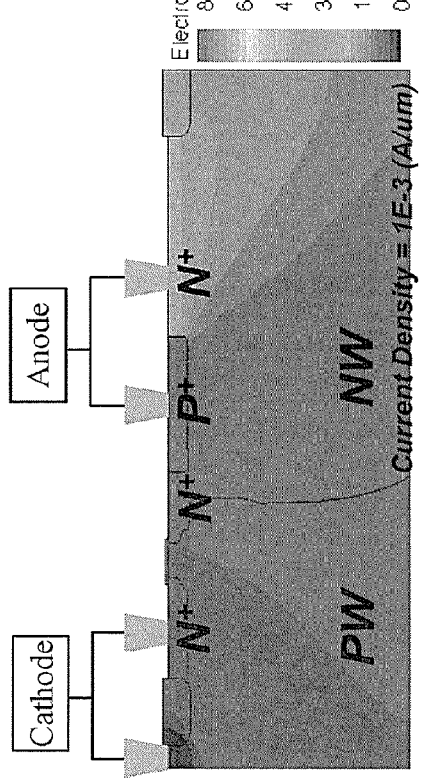
Figure 4C:
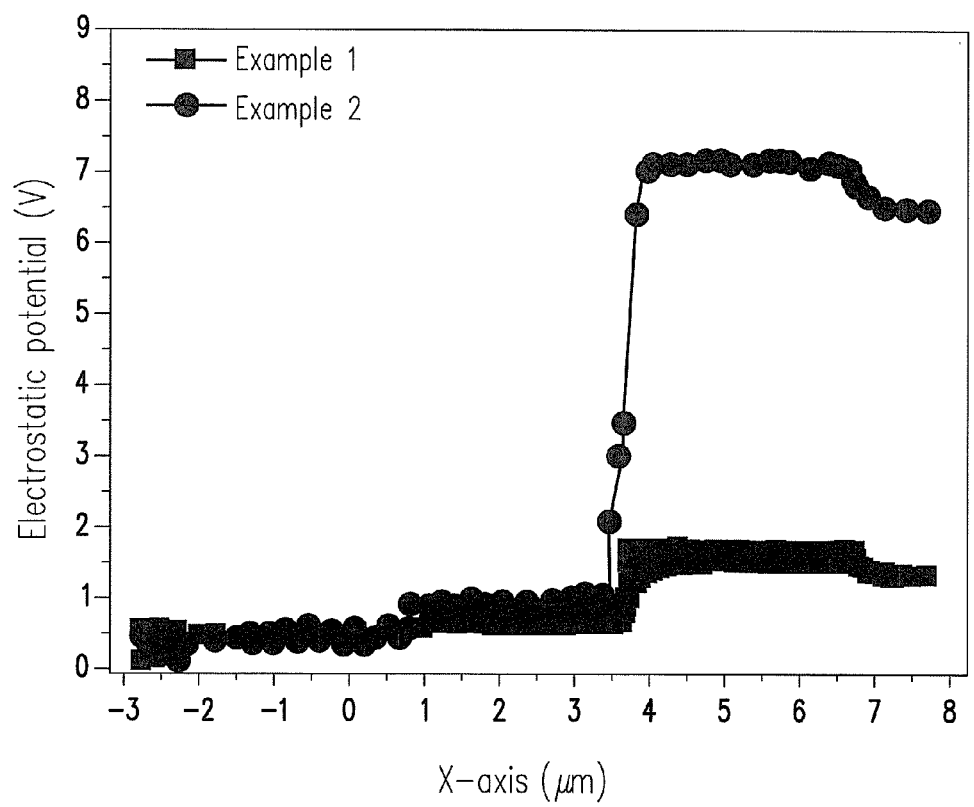
FIG. 4C is a diagram of potential distribution of example 1 and example 2 at a distance of 0.05 μm from the surface of the substrate.

FIG. 4A and FIG. 4B are diagrams of potential distribution of the electrostatic discharge protection structure of each of example 1 and example 2. FIG. 4C is a diagram of potential distribution of example 1 and example 2 at a distance of 0.05 μm from the surface of the substrate.

It can be seen from example 1 of FIG. 4A that, when the anode is connected to the $P^+$ region and the $N^+$ region at the same time, the potential difference between the two regions is very small, complying with the experimental results showing that little current flows between the two regions. In FIG. 4B, the anode is only connected to the $N^+$ region, and the difference in voltage between the $P^+$ region and the $N^+$ region is significantly increased, also complying with the simulation results showing the current is concentrated between the two regions. The difference is also present in FIG. 4C. In FIG. 4C, the x-axis represents, with the gate center as 0, positive distance along the direction of the $N^+/P^+$ diode. It can also be seen from FIG. 4C that, in example 1, the potential difference between the $P^+$ region and the $N^+$ region is small and the potential difference between the $P^+$ region and the $N^+$ region in example 2 is significant.

Figure 5:
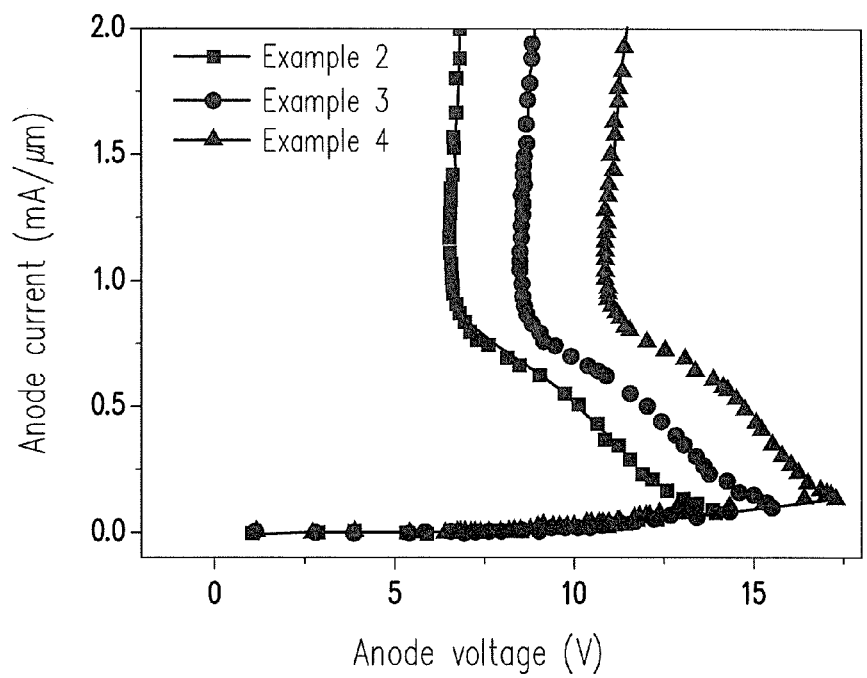
FIG. 5 is a schematic diagram of the relationship between anode current and anode voltage of electrostatic discharge protection structures obtained from the simulation experiment of examples 1 to 3.

A simulation experiment is also conducted on the embodiment in which the distance S exists between the first doped region and the second doped region (that is, the second embodiment corresponding to FIG. 1D), and the results are presented in FIG. 5 and Table 1.

In FIG. 5, three current-voltage (I-V) curves respectively of example 2 (distance S=0 μm), example 3 (distance S=0.05 μm), and example 4 (distance S=0.1 μm) are shown. In particular, the distance S=0 μm of example 2 represents the first doped region and the second doped region of the corresponding FIG. 1A are in direct contact. The distance S=0.05 μm of example 3 represents the distance S=0.05 μm between the first doped region and the second doped region of the corresponding FIG. 1D. The distance S=0.1 μm of example 4 represents the distance S=0.1 μm between the first doped region and the second doped region of the corresponding FIG. 1D.

It is known from the results of FIG. 5 and Table 1 that, with the increase in the distance S between the first doped region and the second doped region, $V_h$ and $V_t$ both increase accordingly. Therefore, $V_h$ and $V_t$ of the electrostatic discharge protection structure can be adjusted by changing the distance S to satisfy the usage requirements of the device.

Figure 6:
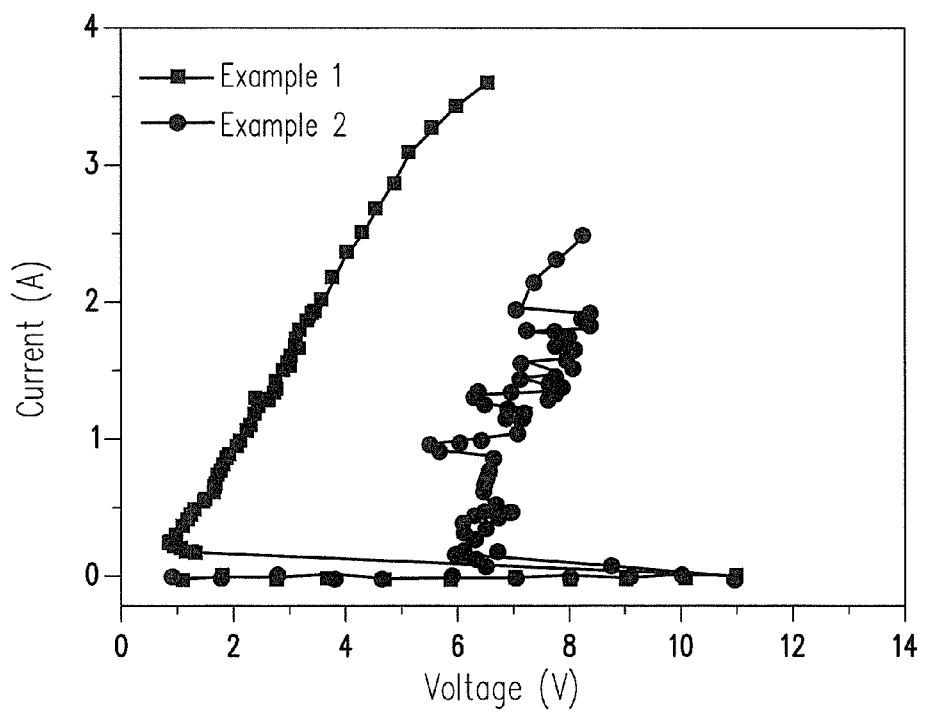
FIG. 6 is a schematic diagram of the relationship between anode current and anode voltage obtained from measurements of component 1 and component 2.

FIG. 6 and Table 2 present results of electrical measurements of two devices, wherein device 1 is made according to the third embodiment and device 2 is made according to the first embodiment.

TABLE 2

|  | $V_t$ (V) | $V_h$ (V) |
|---|---|---|
| Device 1 | 11 | 0.99 |
| Device 2 | 11 | 5.96 |

Referring to FIG. 6 and Table 2, although a reverse diode is disposed in the circuit of device 2, device 2 has a comparable triggering voltage $V_t$ to device 1 and the holding voltage $V_h$ of device 2 is significantly higher than that of device 1. Moreover, both device 1 and device 2 can satisfy the ESD specifications of the human body model (HBM) at 5 kV and the machine model (MM) at 350 V.

Based on the above, the embodiments of the invention provide an electrostatic discharge protection structure and an electrostatic discharge protection circuit. By disposing a doped region (third doped region) spanning the adjacent well region of the first conductivity type and the well region of the second conductivity type, the triggering voltage $V_t$ of the electrostatic discharge protection structure can be reduced. Moreover, through the electrical connection of the contact window disposed only on the first doped region with the electrode and without disposing a contact window on the second doped region (i.e., no electrical connection), current flows through the first doped region first and then flows through the second doped region, thereby increasing the holding voltage $V_h$ of the electrostatic discharge protection structure. Furthermore, by changing the distance S between the first doped region and the second doped region, the triggering voltage $V_t$ and the holding voltage $V_h$ can be slightly adjusted such that the electrostatic discharge protection structure can satisfy specific design requirements (such as operating at a higher operating voltage).

Although the invention has been described with reference to the above embodiments, it will be apparent to one of the ordinary skill in the art that modifications and variations to the described embodiments may be made without departing from the spirit and scope of the invention. Accordingly, the scope of the invention will be defined by the attached claims not by the above detailed descriptions.

What is claimed is:

1. An electrostatic discharge protection structure, comprising:
    a first well region of a first conductivity type disposed in a substrate;

a second well region of a second conductivity type disposed in the substrate and adjacent to the first well region;

a first doped region of the first conductivity type disposed in the first well region;

a second doped region of the second conductivity type disposed in the first well region, wherein a diode is formed between the second doped region and the first doped region, and the second doped region, the first well region, and the second well region form a first bipolar junction transistor electrically connecting to the diode;

a third doped region of the first conductivity type disposed in the first well region and extending into the second well region, wherein the second doped region is disposed between the first doped region and the third doped region;

a fourth doped region of the first conductivity type disposed in the second well region, wherein the fourth doped region, the second well region, and the first well region form a second bipolar junction transistor; and a fifth doped region of the second conductivity type disposed in the second well region, wherein the fourth doped region is disposed between the third doped region and the fifth doped region, wherein the first doped region is electrically connected to a first electrode of the electrostatic discharge protection structure, the fourth doped region and the fifth doped region are electrically connected to a second electrode of the electrostatic discharge protection structure, and a contact window is not disposed on the second doped region.

2. The electrostatic discharge protection structure of claim 1, wherein the first conductivity type is N-type, the second conductivity type is P-type, the first electrode is an anode, and the second electrode is a cathode.

3. The electrostatic discharge protection structure of claim 1, wherein the first conductivity type is P-type, the second conductivity type is N-type, the first electrode is a cathode, and the second electrode is an anode.

4. The electrostatic discharge protection structure of claim 1, further comprising a gate structure disposed on the second well region between the third doped region and the fourth doped region, and the gate structure is electrically connected to the second electrode.

5. The electrostatic discharge protection structure of claim 1, further comprising an isolation structure disposed in the second well region between the third doped region and the fourth doped region.

6. The electrostatic discharge protection structure of claim 5, wherein the isolation structure is a field oxide layer or a shallow trench isolation structure.

7. The electrostatic discharge protection structure of claim 1, wherein the first doped region is in contact with the second doped region.

8. The electrostatic discharge protection structure of claim 1, wherein the first doped region is separated from the second doped region by a distance.

9. The electrostatic discharge protection structure of claim 8, wherein the distance is 0.01 μm to 1 μm.

10. An electrostatic discharge protection circuit, comprising:

a first bipolar junction transistor, wherein an emitter thereof is coupled to a first electrode of the electrostatic discharge protection circuit, a base thereof is coupled to the first electrode of the electrostatic discharge protection circuit through a first resistance, and a collector thereof is coupled to a second electrode of the electrostatic discharge protection circuit through a second resistance;

a second bipolar junction transistor, wherein a base thereof is coupled to the collector of the first bipolar junction transistor, an emitter thereof is coupled to the second electrode of the electrostatic discharge protection circuit, and a collector thereof is coupled to the first electrode of the electrostatic discharge protection circuit through the first resistance; and a diode disposed between the emitter of the first bipolar junction transistor and the first electrode of the electrostatic discharge protection circuit.

11. The electrostatic discharge protection circuit of claim 10, wherein the first bipolar junction transistor is a PNP transistor, the second bipolar junction transistor is an NPN transistor, the first electrode is an anode, the second electrode is a cathode, a positive electrode of the diode is coupled to the emitter of the first bipolar junction transistor, and a negative electrode of the diode is coupled to the first electrode of the electrostatic discharge protection circuit.

12. The electrostatic discharge protection circuit of claim 10, wherein the first bipolar junction transistor is an NPN transistor, the second bipolar junction transistor is a PNP transistor, the first electrode is a cathode, the second electrode is an anode, a negative electrode of the diode is coupled to the emitter of the first bipolar junction transistor, and a positive electrode of the diode is coupled to the first electrode of the electrostatic discharge protection circuit.

13. An electrostatic discharge protection circuit, comprising:

a first bipolar junction transistor, wherein an emitter thereof is coupled to an anode of the electrostatic discharge protection circuit, a base thereof is coupled to the anode of the electrostatic discharge protection circuit through a first resistance, and a collector thereof is coupled to a cathode of the electrostatic discharge protection circuit through a second resistance;

a second bipolar junction transistor, wherein a base thereof is coupled to the collector of the first bipolar junction transistor, an emitter thereof is coupled to the cathode of the electrostatic discharge protection circuit, and a collector of the second bipolar junction transistor is coupled to the anode of the electrostatic discharge protection circuit through the first resistance; and a diode having a positive electrode and a negative electrode, wherein the diode is disposed between the emitter of the first bipolar junction transistor and the anode of the electrostatic discharge protection circuit such that the positive electrode of the diode is coupled to the emitter of the first bipolar junction transistor and the negative electrode of the diode is coupled to the anode of the electrostatic discharge protection circuit, or the diode is disposed between the emitter of the second bipolar junction transistor and the cathode of the electrostatic discharge protection circuit such that the positive electrode of the diode is coupled to the cathode of the electrostatic discharge protection circuit and the negative electrode of the diode is coupled to the emitter of the second bipolar junction transistor.

14. The electrostatic discharge protection structure of claim 13, wherein the first bipolar junction transistor is a PNP transistor and the second bipolar junction transistor is an NPN transistor.

* * * * *